(12) United States Patent
Aisenbrey (10) Patent No.: US 7,198,735 B2
(45) Date of Patent: Apr. 3, 2007

(54) LOW COST ROOFING SHINGLES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 0 days.

(21) Appl. No.: 11/060,274

(22) Filed: Feb. 17, 2005

(65) Prior Publication Data
US 2005/0166956 A1    Aug. 4, 2005

Related U.S. Application Data

(63) Continuation-in-part of application No. 10/877,092, filed on Jun. 25, 2004, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/557,892, filed on Mar. 31, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*H01B 1/22* (2006.01)
*D06N 7/04* (2006.01)
*G21F 3/00* (2006.01)

(52) U.S. Cl. .................. 252/512; 428/147; 52/309.14; 250/517.1

(58) Field of Classification Search ................ 252/511, 252/512, 513, 514; 428/147; 52/309.14; 250/517.1
See application file for complete search history.

(56) References Cited

U.S. PATENT DOCUMENTS 4,788,088 A * 11/1988 Kohl ......................... 428/34.5

(Continued)

FOREIGN PATENT DOCUMENTS

DE        4321564        * 1/1994

(Continued)

OTHER PUBLICATIONS

Co-pending U.S. Appl. No. 11/060,275, filed Feb. 17, 2005, assigned to the same assignee.

*Primary Examiner*—Mark Kopec
(74) *Attorney, Agent, or Firm*—Douglas Schnabel (57) ABSTRACT

Conductive roofing materials are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, aluminum fiber, or the like.

19 Claims, 7 Drawing Sheets

U.S. PATENT DOCUMENTS

| | | | |
|---|---|---|---|
| 5,183,591 A * | 2/1993 | Akahoshi et al. | 252/503 |
| 5,908,584 A * | 6/1999 | Bennett | 252/502 |
| 6,936,191 B2 * | 8/2005 | Fox et al. | 252/512 |
| 2002/0043044 A1 | 4/2002 | Foster et al. | 52/748.1 |
| 2002/0095901 A1 | 7/2002 | Tremblay | 52/543 |
| 2002/0152697 A1 | 10/2002 | Hokkirigawa et al. | 52/173.1 |
| 2002/0180077 A1 | 12/2002 | Glatkowski et al. | 264/36.1 |
| 2002/0189188 A1 | 12/2002 | Iole et al. | 52/536 |
| 2003/0054148 A1 | 3/2003 | Jolitz | 428/220 |
| 2004/0009338 A1 * | 1/2004 | Jo et al. | 428/297.4 |
| 2004/0074164 A1 | 4/2004 | Behrems | 52/173.1 |
| 2004/0241476 A1 | 12/2004 | Friedman et al. | 428/515 |

FOREIGN PATENT DOCUMENTS

| | | | |
|---|---|---|---|
| GB | 377449 A | | 1/2003 |
| JP | 2004-25586 | * | 1/2004 |
| WO | WO2005/040517 | * | 5/2005 |

* cited by examiner

LOW COST ROOFING SHINGLES MANUFACTURED FROM CONDUCTIVE LOADED RESIN-BASED MATERIALS

This application is related to U.S. patent application Ser. No. 11/060,275 and filed Feb. 17, 2005, owned by a common assignee as the instant invention.

This patent application claims priority to the U.S. Provisional Patent Application 60/557,892 filed on Mar. 31, 2004, which is herein incorporated by reference in its entirety.

This patent application is a Continuation-in-Part of U.S. patent application Ser. No. 10/877,092, filed on Jun. 25, 2004, which is a Continuation of U.S. patent application Ser. No. 10/309,429, filed on Dec. 4, 2002, issued as U.S. 6,870,516, also incorporated by reference in its entirety, which is a Continuation-in-Part application of U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to roofing materials and, more particularly, to conductive roofing materials molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Buildings of any kind require a roof, or roofing system, to protect building contents from the environment. The roof, itself, requires a covering material capable of shedding water. Residential roofing systems generally include three-tab shingles as one of the primary roof protection materials and are the roofing industry's current standard. Three-tab shingles consist of two layers of asphalt around a felt or fiberglass mat core covered with ceramic mineral granules. The shingles are typically notched into three integrated pieces, or tabs. On shallow pitched, or flat, roofs an asphalted felt or a fiberglass rolled roofing is the common protection material. Alternately, a synthetic rubber or a special Polyvinyl Chloride (PVC) plastic sheet is becoming more common for the flat or shallow pitched roof.

In commercial structures, in particular metal buildings, a standing seam metal roof is frequently used. A standing seam metal roof is constructed of interlocking metal panels that run vertically from the roof's ridge (the top of the roof) to the eave. The interlocking seam where two panels join together is raised above the roof's flat surface, allowing water to run off without seeping between metal panels. Other common types of roofing materials are ceramic or concrete tiles. These tiles are assembled to provide a waterproof and fireproof roof.

Shedding of water, or precipitation, is not the only consideration in roofing material applications. Other considerations include dealing with lighting, electromagnetic energy, heat build-up, and corrosion. Buildings that are in locations that are subject to lighting strikes, may need to provide lighting arrestors to allow any charge accumulated during a thunderstorm to be dissipated from the vicinity of the building without damaging the building. Most roofing materials, such as prior art shingles and roofing tiles, are good insulators. Therefore, these materials do not typically provide a path for dissipation of electrical charge as it accumulates. Metal roofs are inherently conductive. However, due to the desire to prevent corrosion, most metal roofing materials are coated or painted as a rust inhibitor. These coatings are typically insulating and thus reduce the ability to dissipate electrical charge or to prevent a lightening strike.

Several prior art inventions relate to roofing materials. U.S. Patent Publication U.S. 2002/0043044 A1 to Foster et al teaches a method of shingle composition that utilizes a rubber component in the range from about 5–95% by weight and a polyolefin component in the range of about 5–50% by weight. This invention teaches that the weight of this shingle to be less than 150 pounds per roofing square for ⅛ inch thickness as compared to typical asphalt shingles weighing 185 pounds per roofing square of the same thickness. U.S. Patent Publication U.S. 2002/0095901 A1 to Tremblay teaches a metal roofing shingle comprising a flat rectangular panel made of metallic sheet material. U.S. Patent Publication U.S. 2004/0241476 A1 to Friedman et al teaches a synthetic roofing shingle or tile that utilizes a core of recycled inexpensive materials with an outer skin material of greater quality and weather resistance. U.S. Patent Publication U.S. 2003/0054148 A1 to Jolitz teaches a composite roofing shingle that comprises about 35–65% polyethylene and 50–70% crushed limestone filler. U.S. Patent Publication U.S. 2002/0189188 A1 to Iole et al teaches a roofing system for buildings with synthetic resin molded components formed of entirely recyclable material. U.S. Patent Publication U.S. 2002/0152697 A1 to Hokkirigawa et al teaches a roofing tile and snow-melting, tiled roof using the same. This invention utilizes a fire resistant ceramic tile with an embedded nichrome wire for a resistive heat element. U.S. Patent Publication U.S. 2004/0074164 A1 to Behrens teaches a high frequency reducing green roofing that utilizes a layer of textile fibers, a vegetation layer, and a flat or three-dimensional structure of electrically conductive filaments. U.S. Patent Publication U.S. 2002/0180077 A1 to Glatkowski et al teaches a carbon nanotube fiber-reinforced composite structure for electromagnetic and lightning strike protection. This invention utilizes electrically conductive carbon nanotubes to act as the conductive filler.

SUMMARY OF THE INVENTION

A principal object of the present invention is to provide effective conductive roofing materials.

A further object of the present invention is to provide a method to form conductive roofing materials.

A further object of the present invention is to provide conductive roofing materials molded of conductive loaded resin-based materials.

A yet further object of the present invention is to provide methods to fabricate conductive roofing materials from a conductive loaded resin-based material incorporating various forms of the material.

A yet further object of the present invention is to provide a method to fabricate conductive roofing materials from a conductive loaded resin-based material where the material is in the form of a fabric.

In accordance with the objects of this invention, a conductive roofing device is achieved. The device comprises a conductive loaded, resin-based material comprising conductive materials in a base resin host.

Also in accordance with the objects of this invention, a conductive roofing device is achieved. The device comprises a conductive loaded, resin-based material comprising conductive materials in a base resin host. The weight of the conductive materials is between 20% and 50% of the total weight of the conductive loaded resin-based material.

Also in accordance with the objects of this invention, a conductive roofing device is achieved. The device comprises a conductive loaded, resin-based material comprising micron conductive fiber in a base resin host. The weight of the micron conductive fiber is between 20% and 50% of the total weight of the conductive loaded resin-based material. A plurality of conical surface appendages on the conductive roofing device are of the conductive loaded resin-based material.

Also in accordance with the objects of this invention, a method to form a conductor roofing device is achieved. The method comprises providing a conductive loaded, resin-based material comprising conductive materials in a resin-based host. The conductive loaded, resin-based material is molded into a conductive roofing device.

Also in accordance with the objects of this invention, a method to form a conductive roofing device is achieved. The method comprises providing a conductive loaded, resin-based material comprising conductive materials in a resin-based host. The percent by weight of the conductive materials is between 20% and 40% of the total weight of the conductive loaded resin-based material. The conductive loaded, resin-based material is molded into a conductive roofing device.

Also in accordance with the objects of this invention, a method to form a conductive roofing device is achieved. The method comprises providing a conductive loaded, resin-based material comprising micron conductive fiber in a resin-based host. The percent by weight of the micron conductive fiber is between 25% and 35% of the total weight of the conductive loaded resin-based material. The conductive loaded, resin-based material is molded into a conductive roofing device. Conical surface appendages are formed of the conductive loaded resin-based material on the top surfaces of the conductive roofing device.

BRIEF DESCRIPTION OF THE DRAWINGS

In the accompanying drawings forming a material part of this description, there is shown.

DESCRIPTION OF THE PREFERRED EMBODIMENTS

This invention relates to conductive roofing materials molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of conductive roofing materials fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the conductive roofing materials are substantially homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

The use of conductive loaded resin-based materials in the fabrication of conductive roofing materials significantly lowers the cost of materials and the design and manufacturing processes used to hold ease of close tolerances, by forming these materials into desired shapes and sizes. The conductive roofing materials can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, aluminum fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the conductive roofing materials. The doping composition and directionality associated with the micron conductors within the loaded base resins can affect the electrical and structural characteristics of the conductive roofing materials and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming conductive roofing materials that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in conductive roofing material applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, conductive roofing materials manufactured from the molded conductor loaded resin-based material can provide added thermal dissipation capabilities to the application. For example, heat can be dissipated from electrical devices physically and/or electrically connected to conductive roofing materials of the present invention.

As a significant advantage of the present invention, conductive roofing materials constructed of the conductive loaded resin-based material can be easily interfaced to an electrical circuit or grounded. In one embodiment, a wire can be attached to a conductive loaded resin-based conductive roofing material via a screw that is fastened to the material. For example, a simple sheet-metal type, self-tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the conductive roofing material and a grounding wire.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

Figure 1A:
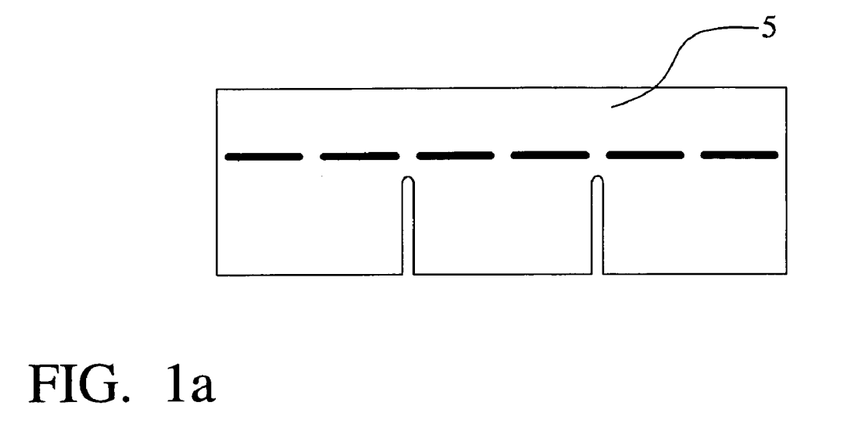
FIGS. 1a and 1b illustrate a first preferred embodiment of the present invention showing conductive roofing shingles formed of conductive loaded resin-based material according to the present invention and, more particularly, illustrates three-tabbed roofing shingles as used in a building roofing system.
Figure 1B:
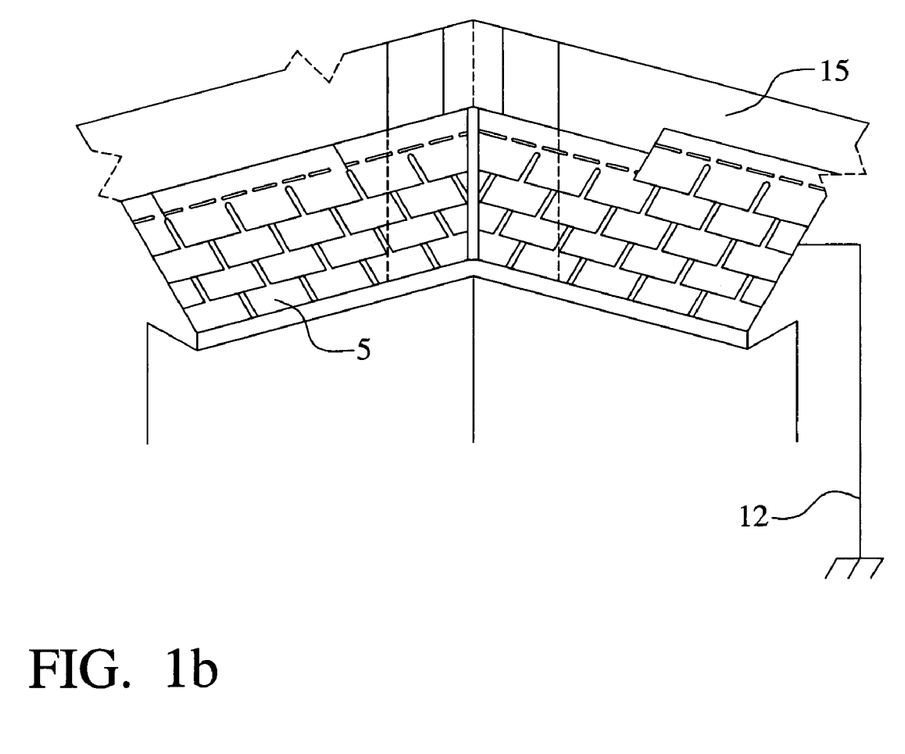

Referring now to FIGS. 1a and 1b, a first preferred embodiment of the present invention is illustrated. A conductive roofing shingle 5 and a protective roofing system 15 are shown. The conductive roofing shingle 5 and protective roofing system 15 are formed of conductive loaded resin-based materials. The conductive roofing shingle 5 and protective roofing system 15 are structured to provide both environmental protection for a roof a path for dissipating electrical charge generated in an electrical storm. A very low cost, flexible, roofing shingle 5 is formed from conductive loaded resin-based materials. Several important features of the present invention are shown and discussed below.

Referring particularly to FIG. 1a, a very low cost roofing shingle is shown comprising conductive loaded resin-based materials. A conductive three-tab shingle 5, as is commonly used in the art of residential construction, is shown. Referring particularly to FIG. 1b, a plurality of the conductive roofing shingles 5 is placed at the upper area of a building to form a protective roofing system 15. The roofing shingles 5 provide for dissipation of electrical charge to lessen the probability of a lightening strike. The conductive loaded resin-based materials 10 of the roofing shingles 5 are connected together directly with appropriate conductors or indirectly with the fasteners that attach the shingles 5 to the roof of the building. The shingles are then connected with an appropriate conductor to provide a conductive path 12 to the electrical earth ground.

The roofing shingle 5 as described is manufactured of conductive loaded resin-based materials 10 comprising micron conductive powders, micron conductive fibers, or a combination thereof, substantially homogenized within a base resin. In one preferred embodiment, the conductive shingles 5 are formed by calendaring the conductive loaded resin-based material into a thin sheet. The sheet of conductive loaded resin-based material is then cut or stamped into the desired shape. In another preferred embodiment, the conductive loaded resin-based material is extruded into a thin sheet and then cut or stamped into the desired shape. In another embodiment, the conductive loaded resin-based material is vacuumed formed to the desired conductive shingle shape. In another embodiment, the conductive loaded resin-based material is injection molded to form the conductive shingle 5. In another embodiment, the conductive loaded resin-based material is calendered or is extruded and then stacked into a laminate prior to cutting or stamping into the desired shape. The roofing shingle 5 of FIGS. 1a and 1b are exemplary. The roofing shingle 5 may be shaped into any form necessary for an application.

Figure 11:
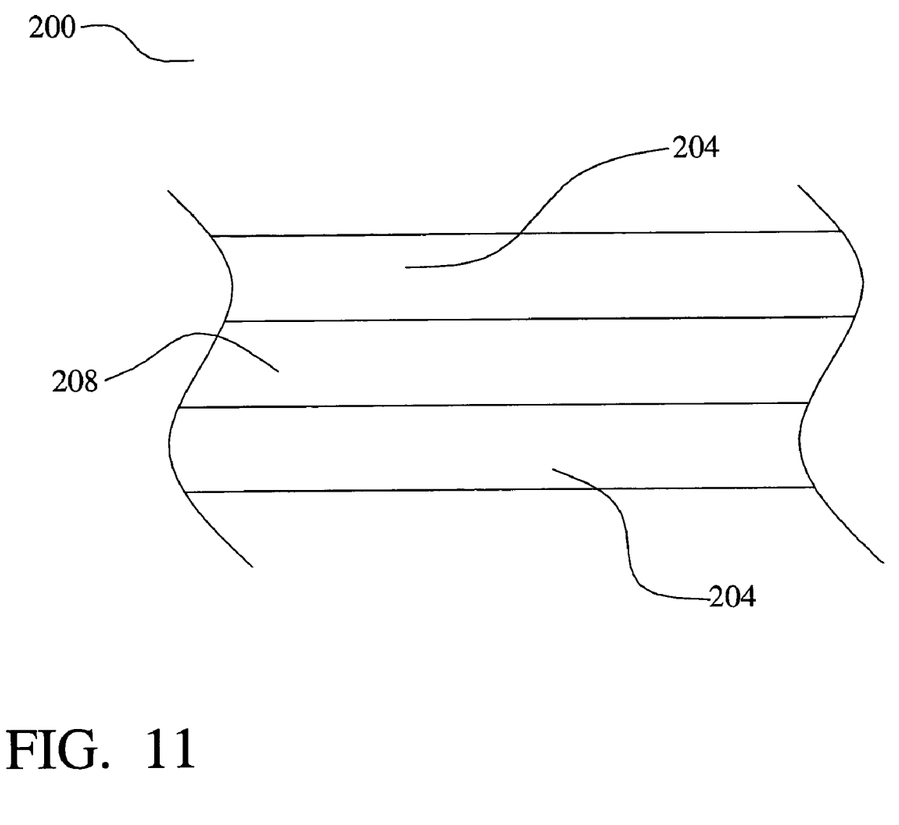
FIG. 11 illustrates a sixth preferred embodiment of the present invention showing a conductive roofing device of the conductive loaded resin-based material and having a structural layer.

In another embodiment, the conductive loaded resin-based material is over-molded onto an inner layer, such as asphalted felt, fiberglass, or another structural material. Referring now to FIG. 11, a cross section of a roofing device 200 comprising the conductive loaded resin-based material 204 and an inner structural layer 208 is shown.

The conductive roofing devices of the present invention provide a conductive path to discharge electrical energy. The conductivity of the conductive loaded resin-based material can be optimized to achieve the needed conductive/resistive characteristics for a given application. The doping level of the conductive loading is controlled by the percent, by weight, of the conductive loading and is controlled by the type of loading that is selected. Further, the conductive roofing devices can be made non-corrosive by selecting a non-corrosive conductive loading material, such as stainless steal, and combining this with a non-corrosive resin-based material.

Figure 7:
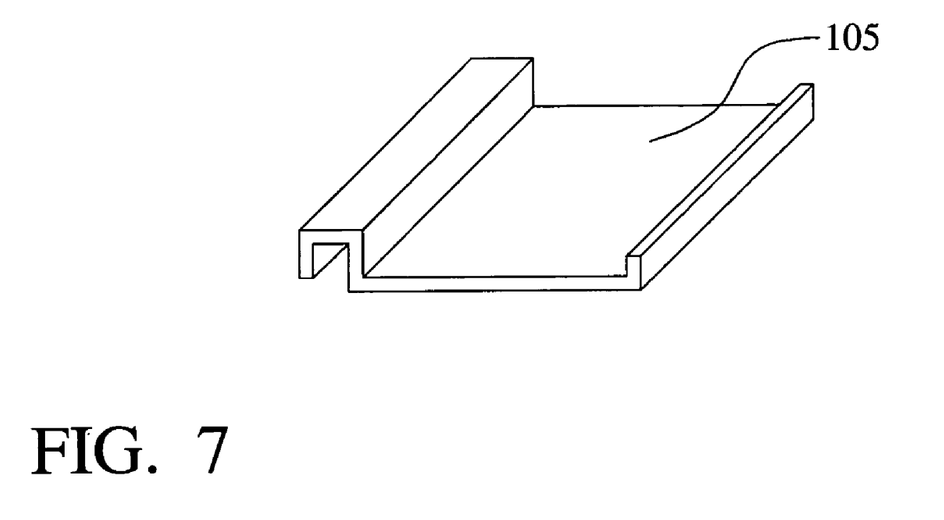
FIG. 7 illustrates a second preferred embodiment of the present invention showing a conductive standing seam roofing panel formed of conductive loaded resin-based material according to the present invention.

Referring now to FIG. 7, a second preferred embodiment of the present invention is illustrated. A conductive standing seam roofing panel 105 comprising the conductive loaded resin-based material of the present invention is shown. In one preferred embodiment, the conductive standing seam roofing panel 105 is formed by calendaring the conductive loaded resin-based material into a thin sheet. The sheet of conductive loaded resin-based material is then cut or stamped into the desired shape. In another preferred embodiment, the conductive loaded resin-based material is extruded into the desired shape. In another embodiment, the conductive loaded resin-based material is vacuumed formed to the desired conductive standing seam roofing panel 105 shape. In another embodiment, the conductive loaded resin-based material is injection molded to form the conductive standing seam roofing panel 105. In another embodiment, the conductive loaded resin-based material is over-molded onto an inner layer, such as asphalted felt, fiberglass, or another structural material. In another embodiment, the conductive loaded resin-based material is calendered or is extruded into thin sheets which are then stacked into a laminate prior to cutting or stamping into the desired shape. A metal roofing panel of the prior art is subject to oxidation and corrosion. This is a serious concern that reduces the lifetime, the electrical contact and the performance of prior art roofing panel. The conductive loaded resin-based material is easily formulated to prevent oxidation and corrosion and to provide the electrical conductivity of the roofing panel 20.

Figure 8:
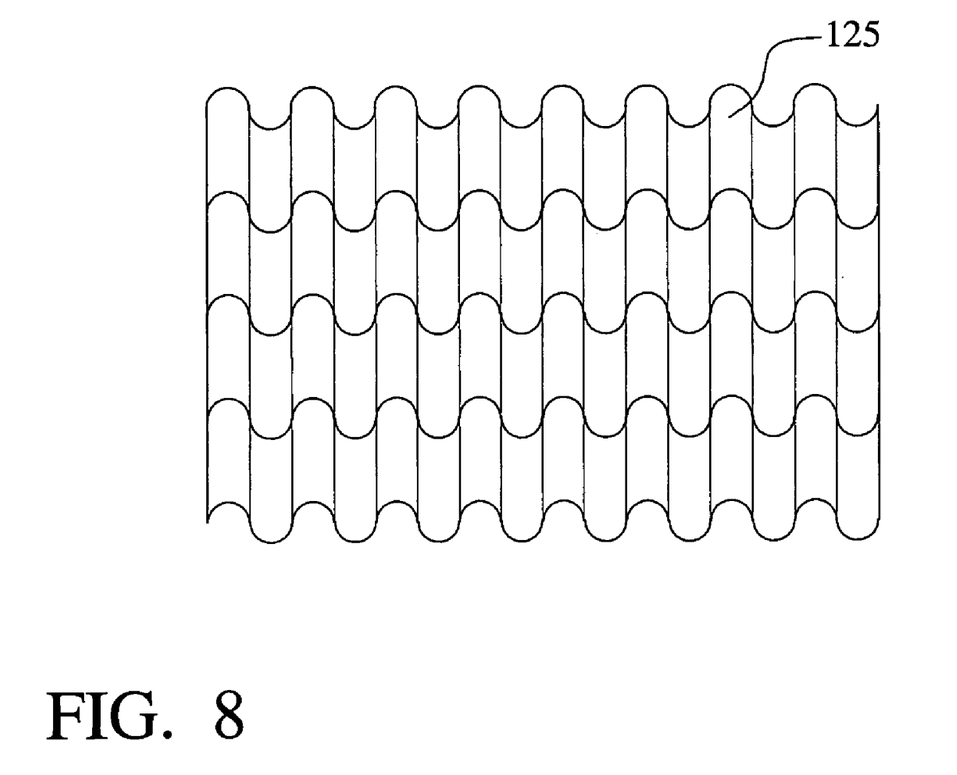
FIG. 8 illustrates a third preferred embodiment of the present invention showing conductive tile roofing formed of conductive loaded resin-based material according to the present invention.

Referring now to FIG. 8, a third preferred embodiment of the present invention is illustrated. A conductive roofing tile 125 formed of the conductive loaded resin-based materials of the present invention is shown. In one preferred embodiment, the conductive roofing tile 125 is formed by calendaring the conductive loaded resin-based material into a thin sheet. The sheet of conductive loaded resin-based material is then stamped and/or cut into the desired shape. In another preferred embodiment, the conductive loaded resin-based material is extruded into the desired shape. In another embodiment, the conductive loaded resin-based material is vacuumed formed to the desired conductive roofing tile 125 shape. In another embodiment, the conductive loaded resin-based material is injection molded to form the conductive roofing tile 125. In another embodiment, the conductive loaded resin-based material is over-molded onto an inner layer, such as asphalted felt, fiberglass, or another structural material. In another embodiment, the conductive loaded resin-based material is calendered or is extruded into thin sheets which are then stacked into a laminate prior to cutting or stamping into the desired shape.

Figure 9:
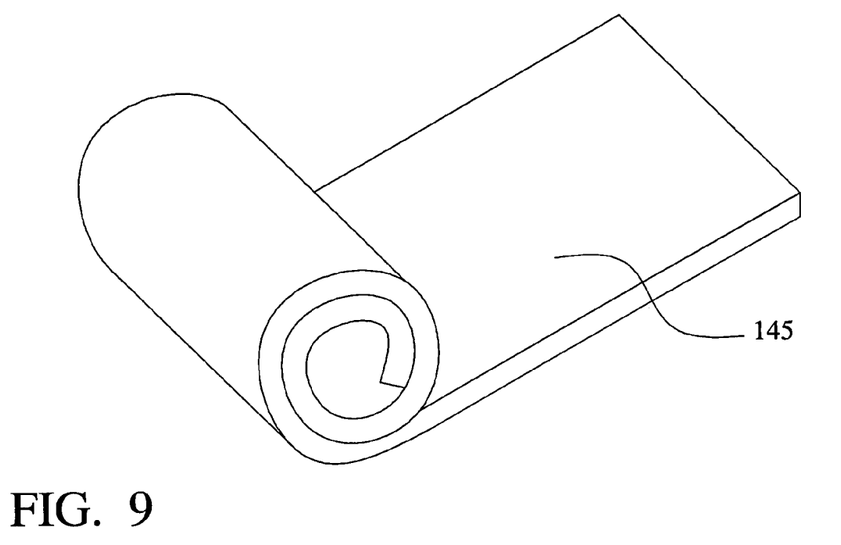
FIG. 9 illustrates a fourth preferred embodiment of the present invention showing a conductive roll roofing material.

Referring now to FIG. 9, a fourth preferred embodiment of the present invention is illustrated. A conductive roll roofing material 145 formed of the conductive loaded resin-based materials of the present invention is shown. Roll roofing is particularly useful for covering flat roofs and is frequently used in commercial buildings. In one preferred embodiment, the conductive roll roofing material 145 is formed by calendaring the conductive loaded resin-based material into a thin sheet. The sheet of conductive loaded resin-based material is then cut to the desired length. In another preferred embodiment, the conductive loaded resin-based material is extruded into a thin sheet and then cut to the desired length. In another embodiment, the conductive loaded resin-based material is co-extruded onto an inner layer, such as asphalted felt, fiberglass, or another structural material. In another embodiment, the conductive loaded resin-based material is calendered or is extruded into thin sheets which are then stacked into a laminate prior to cutting to the desired length.

Figure 10:
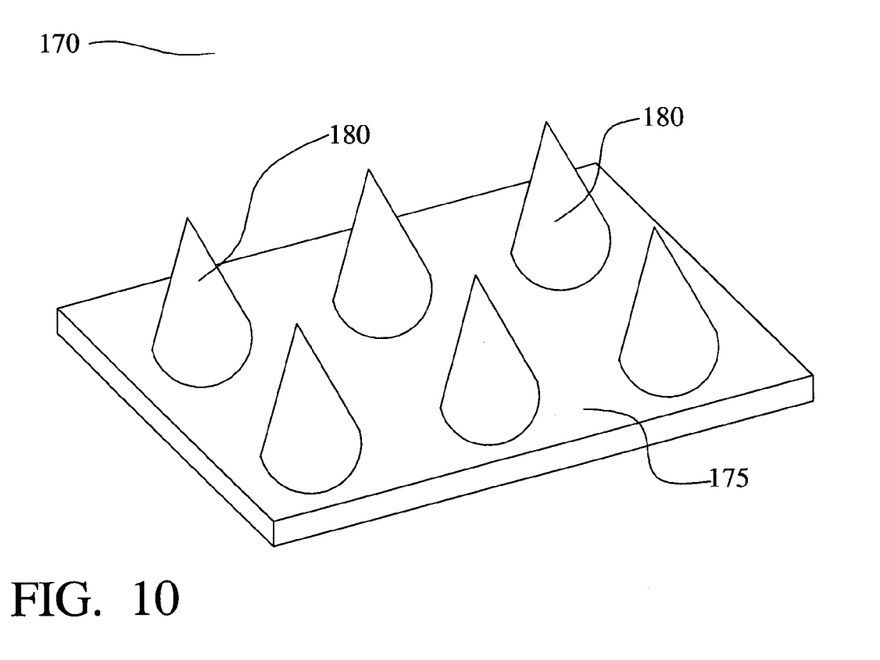
FIG. 10 illustrates a fifth preferred embodiment of the present invention showing an electrical charge dissipative top surface of a roofing panel formed of conductive loaded resin-based material according to the present invention.

The roofing materials of the preferred embodiments, including the conductive roofing shingle 5 of FIGS. 1a and 1b, the conductive standing seam roof panel 105, of FIG. 7, the conductive roofing tile 125 of FIG. 8, and the conductive roll roofing material 145 of FIG. 9, may be provided with appendages for the dissipation of the electrical charge build up during an electrical storm that can lead to a lightening strike. Referring now to FIG. 10, fifth preferred embodiment 170 of the present invention is illustrated. In this embodiment 170, appendages 180 are molded into the surface of the conductive loaded resin-based roofing material 175. The appendages 180 are useful in any of the above-described roofing materials and/or systems. In the preferred embodiment, these appendages 180 are conical shapes. The conical shapes 180 are sized to allow for electrical charge to dissipate from the roofing system to thereby protect the building structure from a lighting strike.

The conductive loaded resin-based materials employed in the roofing shingles, roofing panels, roofing tiles, or roll roofing material described above are also thermally conductive. Thus these roofing materials may be used to transmit heat energy that is generated by sunlight falling on the roofing system of the building. In one preferred embodiment, roofing materials and systems comprising the conductive loaded resin-based material of the present invention are used as radiators for cooling the building structure. In another embodiment, the roofing materials and systems include piping for carrying fluid which is heated and stored for a solar heating device.

In a preferred embodiment, the conductive roofing shingles, roofing panels, roofing tiles, and roll roofing material as described herein are formed entirely of the conductive loaded resin-based materials. In another embodiment, the conductive loaded resin-based materials are laminated to a substrate such as asphalted felt, fiberglass, or other structural materials.

Figure 2:
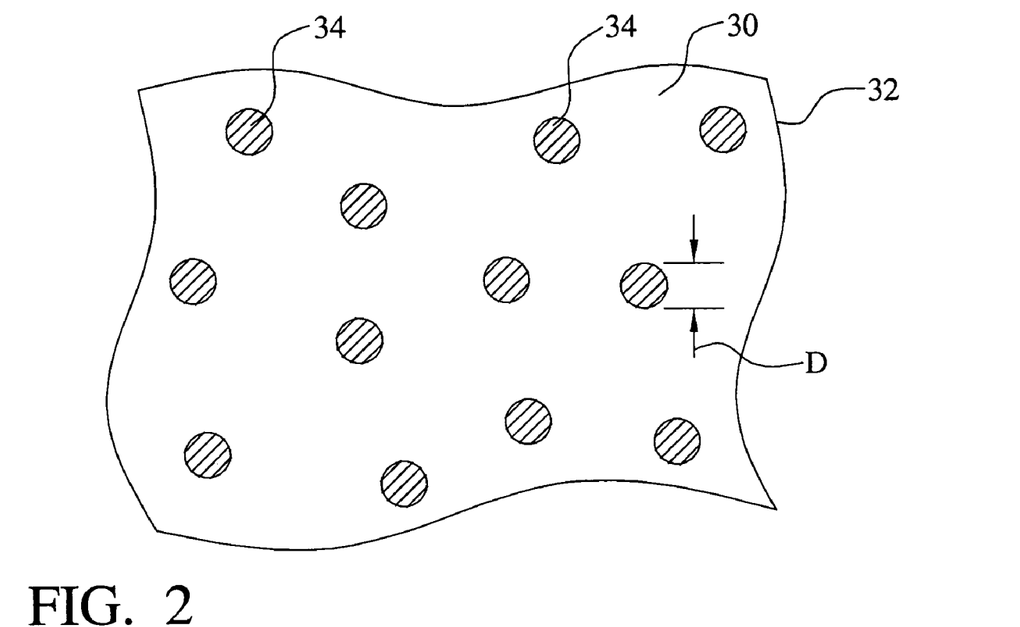
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
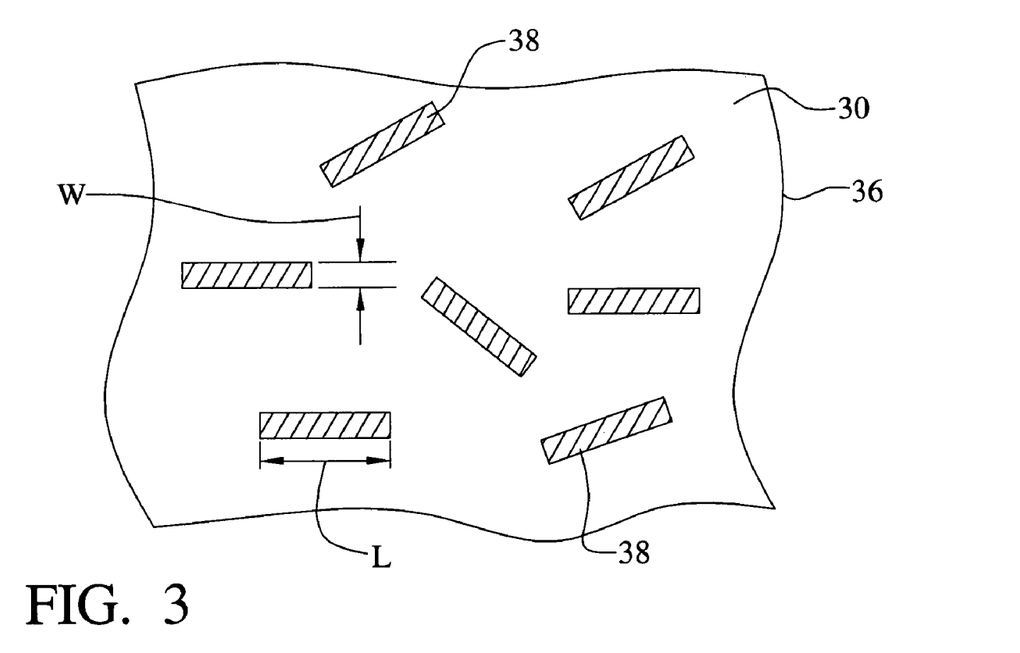
FIG. 3 illustrates a second preferred embodiment of a conductive loaded resin-based material wherein the conductive materials comprise micron conductive fibers.
Figure 4:
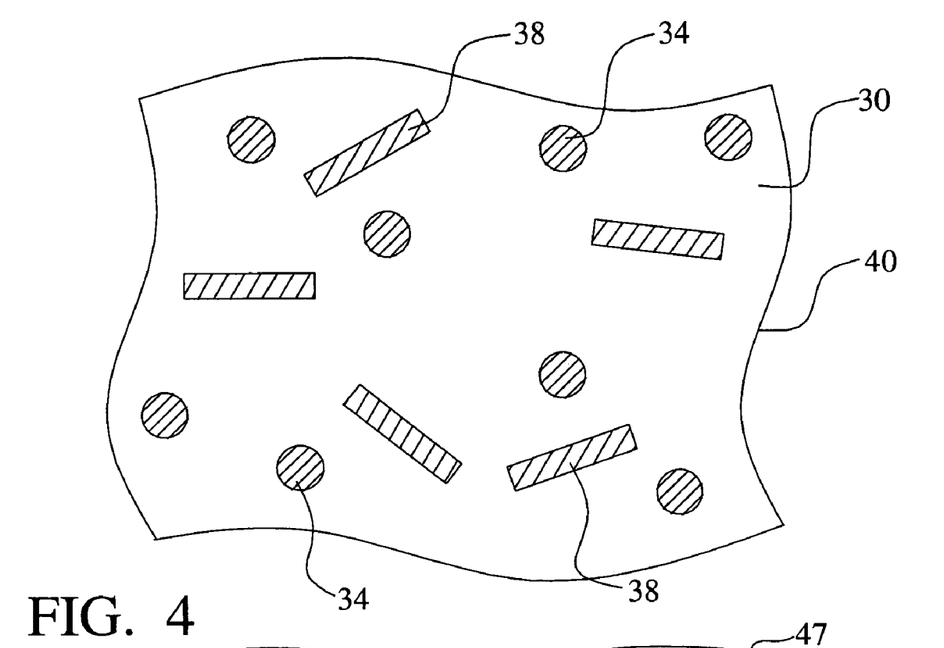
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, aluminum, or other suitable metals or conductive fibers, or combinations thereof. These conductor particles and or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6–12 micron in diameter and lengths of 4–6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
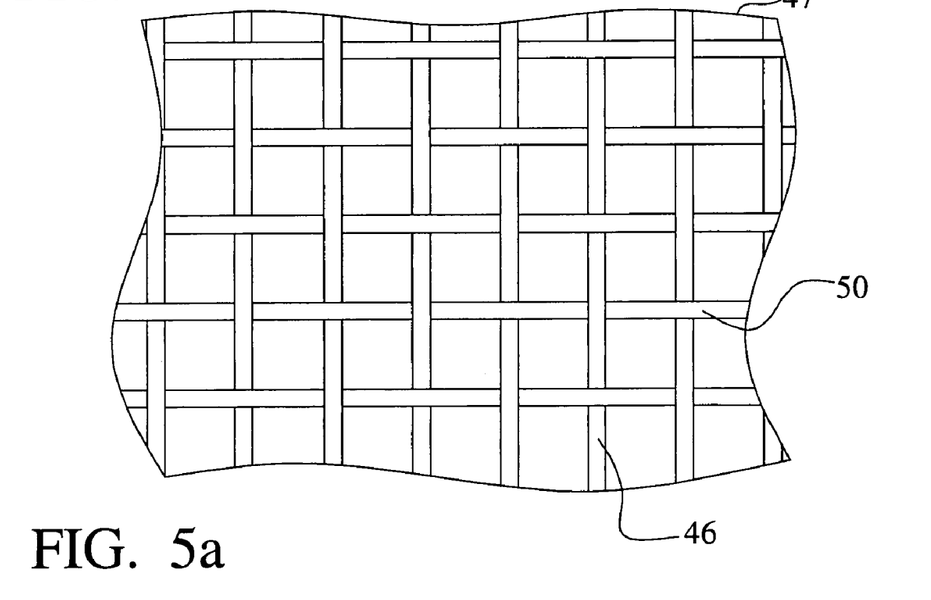
FIGS. 5a and 5b illustrate a fourth preferred embodiment wherein conductive fabric-like materials are formed from the conductive loaded resin-based material.
Figure 5B:
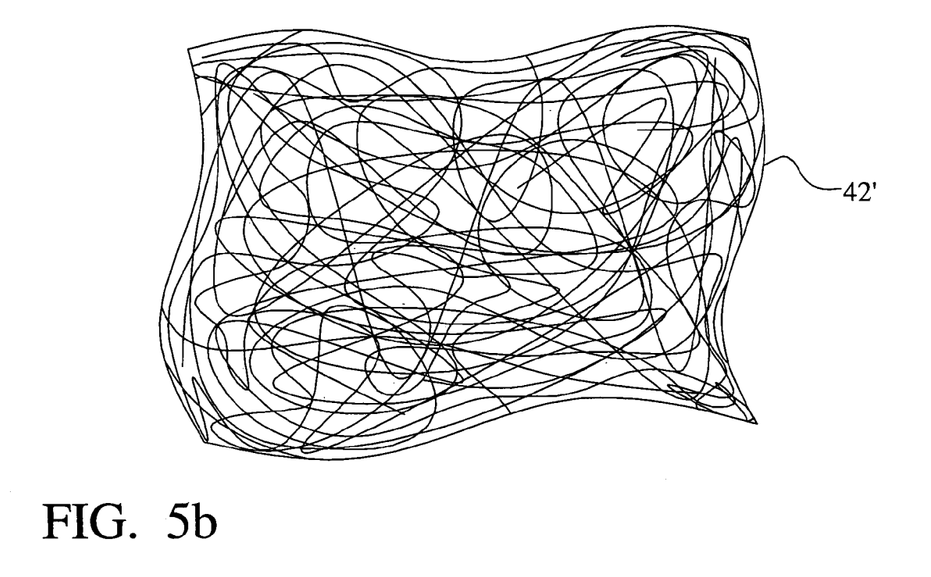

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
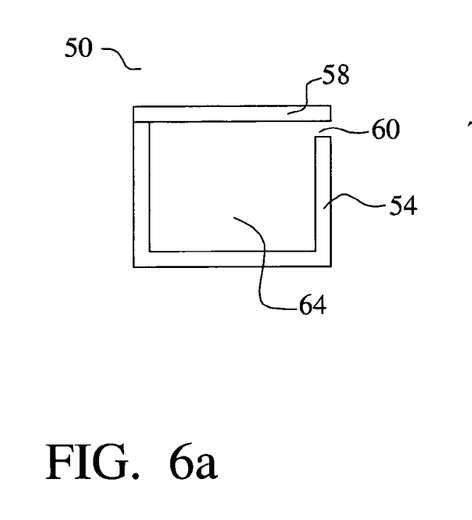
FIGS. 6a and 6b illustrate, in simplified schematic form, an injection molding apparatus and an extrusion molding apparatus that may be used to mold roofing shingles of a conductive loaded resin-based material.

Conductive roofing materials formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the conductive roofing materials are removed.

Figure 6B:
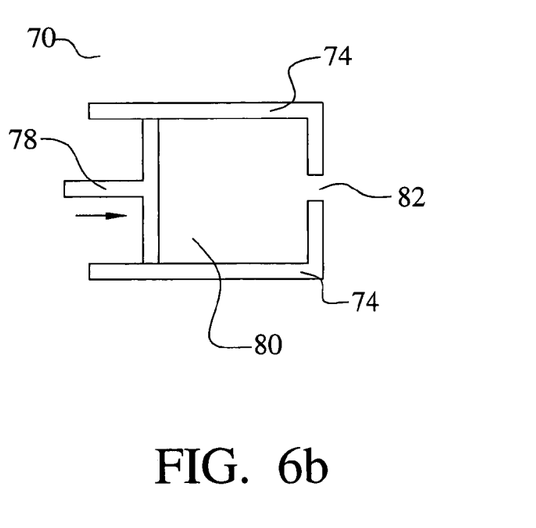

FIG. 6b shows a simplified schematic diagram of an extruder 70 for forming conductive roofing materials using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Effective conductive roofing materials are achieved. Methods to form conductive roofing materials are achieved. Methods to fabricate conductive roofing materials from a conductive loaded resin-based material incorporating various forms of the material are achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A conductive roofing device comprising a conductive loaded, resin-based material comprising metal-containing micron conductive fiber substantially homogenized in a base resin host wherein said conductive loaded, resin-based material is shaped into a roofing shingle.

2. The device according to claim 1 wherein the percent by weight of said metal containing micron conductive fiber is between about 20% and about 50% of the total weight of said conductive loaded resin-based material.

3. The device according to claim 1 wherein said conductive loaded, resin-based material further comprises micron conductive powder.

4. The device according to claim 1 wherein said metal-containing micron conductive fiber is metal.

5. The device according to claim 1 wherein said metal-containing micron conductive fiber are non-conductive materials with metal plating.

6. The device according to claim 1 wherein said conductive roofing device further comprises conical surface appendages of said conductive loaded resin-based material.

7. The device according to claim 1 further comprising an inner structural layer of fiberglass or asphalted felt.

8. A conductive roofing device comprising a conductive loaded, resin-based material comprising metal containing micron conductive fiber substantially homogenized in a base resin host wherein the weight of said metal containing micron conductive fiber is between 20% and 50% of the total weight of said conductive loaded resin-based material and wherein said conductive loaded, resin-based material is shaped into a roofing panel.

9. The device according to claim 8 wherein said metal containing micron conductive fiber are nickel plated carbon micron fiber, stainless steel micron fiber, copper micron fiber, silver micron fiber or combinations thereof.

10. The device according to claim 8 wherein said conductive loaded, resin-based material further comprises conductive powder.

11. The device according to claim 10 wherein said conductive powder is nickel, copper, or silver.

12. The device according to claim 10 wherein said conductive powder is a non-conductive material with a metal plating of nickel, copper, silver, or alloys thereof.

13. The device according to claim 8 wherein said conductive roofing device further comprises conical surface appendages of said conductive loaded resin-based material.

14. The device according to claim 8 further comprising an inner structural layer of fiberglass or asphalted felt.

15. A conductive roofing device comprising:
a conductive loaded, resin-based material comprising micron conductive fiber substantially homogenized in a base resin host wherein the weight of said micron conductive fiber is between 20% and 50% of the total weight of said conductive loaded resin-based material; and
a plurality of conical surface appendages of said conductive loaded resin-based material.

16. The device according to claim 15 wherein said micron conductive fiber is stainless steel.

17. The device according to claim 15 further comprising conductive powder.

18. The device according to claim 15 wherein said micron conductive fiber has a diameter of between about 3 µm and about 12 µm and a length of between about 2 mm and about 14 mm.

19. The device according to claim 15 further comprising an inner structural layer of fiberglass or asphalted felt.

* * * * *